United States Patent
Jeong et al.

(10) Patent No.: US 7,254,803 B2
(45) Date of Patent: Aug. 7, 2007

(54) TEST STRUCTURES FOR FEATURE FIDELITY IMPROVEMENT

(75) Inventors: Seongtae Jeong, Portland, OR (US); Yan Borodovsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 10/955,748

(22) Filed: Sep. 30, 2004

(65) Prior Publication Data

US 2006/0075366 A1    Apr. 6, 2006

(51) Int. Cl.
  *G06F 17/50* (2006.01)
(52) U.S. Cl. ............... 716/21; 716/5; 716/19
(58) Field of Classification Search .......... 716/5, 716/19–21
  See application file for complete search history.

(56) References Cited

U.S. PATENT DOCUMENTS

| | | | |
|---|---|---|---|
| 6,063,132 A * | 5/2000 | DeCamp et al. ............... 716/5 |
| 6,343,370 B1 * | 1/2002 | Taoka et al. ................... 716/21 |
| 6,553,559 B2 | 4/2003 | Liebmann et al. |
| 6,709,793 B1 | 3/2004 | Brankner et al. |
| 6,721,938 B2 | 4/2004 | Pierrat et al. |
| 6,920,620 B2 * | 7/2005 | Hsiao et al. ................... 716/4 |
| 2003/0135831 A1 * | 7/2003 | Hsiao et al. ................... 716/4 |
| 2006/0023932 A1 * | 2/2006 | DeMaris et al. ............ 382/145 |

OTHER PUBLICATIONS

Radojcic, R., et al., "At finer geometries, a new cause for low yields", *EETimes*, Apr. 23, 2003, 2 pages.
Schellenberg, F., "Sub-Wavelenght Lithography Using OPC", *Semiconductor Fabtech* - 9th Ed., pp. 205-209, Mar. 1999.
Taravade, K., et al., "Two dimensional image-based model calibration for OPC applications", *Proc. of the SPIE*, vol. 5377, pp. 1522-1527 (2004).

* cited by examiner

*Primary Examiner*—Stacy A Whitmore
(74) *Attorney, Agent, or Firm*—Fish & Richardson P.C.

(57) ABSTRACT

Systems and techniques for generating test structures. The test structures may conform to a set of design rules for a portion of an integrated circuit design. The test structures may include base figures, which may be in an enriched environment. For example, the test structures may include one or more additional figures such as surrounding figures, external figures, and/or symmetric figures. A correction algorithm for correcting a layout may be checked using a plurality of the test structures.

50 Claims, 7 Drawing Sheets

TEST STRUCTURES FOR FEATURE FIDELITY IMPROVEMENT

BACKGROUND

Integrated circuits are formed by patterning successive layers on a substrate such as a silicon wafer. Each of the successive circuit layers is typically patterned using a lithography process. In a lithography process, light (or massive particles, such as ions or electrons) interacts with a mask that includes a pattern to be transferred to a substrate. Radiation then transfers the mask pattern to the surface of a substrate.

One concern in a lithography process is that the layer design layout be accurately reproduced on the surface of the substrate. However, the optical characteristics of the lithography system may not reproduce the design layout with adequate fidelity. For example, an optical projection system including lenses is typically positioned between the mask and substrate. The lens system may act as a low band-pass filter, so that some information carried by the radiation may not reach the substrate. Because some information being carried by the radiation may be lost, features patterned on the substrate may differ from the corresponding mask feature.

Figure 1A:
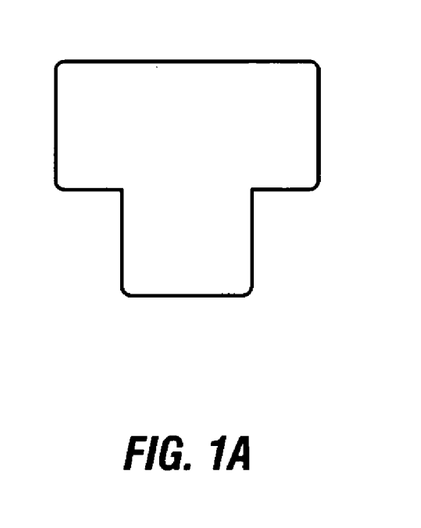
FIGS. 1A to 1D illustrate the use of correction features to improve pattern fidelity.
Figure 1B:
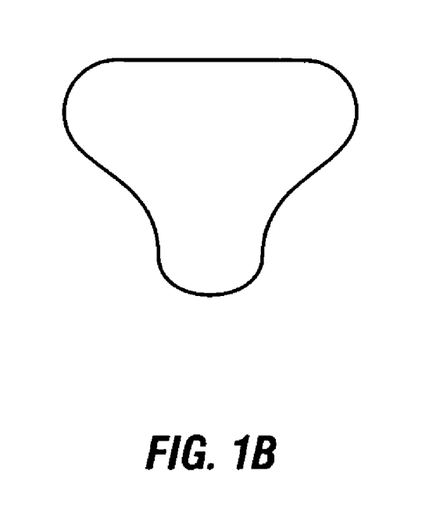
Figure 1C:
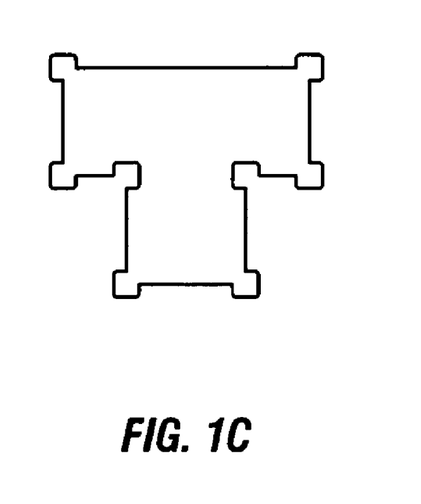
Figure 1D:
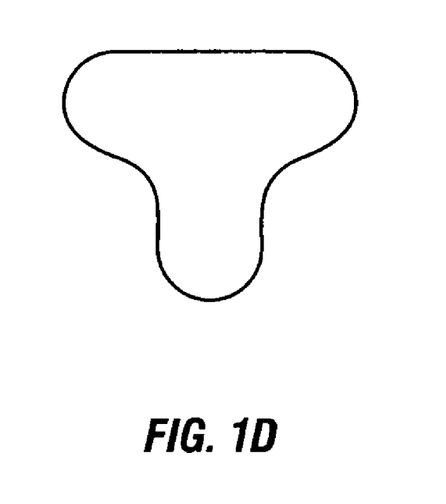

One method that may be used to more accurately reproduce the intended design on the substrate is to include additional features on the mask, such as optical proximity correction (OPC) features. FIGS. 1A to 1D illustrate an example of an OPC feature that may be used to increase pattern fidelity. FIG. 1A shows a T-shaped mask feature with dimensions near the resolution limit of a projection lens of a lithography system. FIG. 1B shows that the feature of FIG. 1A as transferred to the surface of a substrate is significantly distorted due to rounding of the corners. FIG. 1C shows the mask feature with added OPC serifs. FIG. 1D illustrates that the rounding is improved due to the inclusion of OPC serifs on the mask.

For each layer layout of a particular integrated circuit or combination of integrated circuits, circuit designers apply a number of design rules (e.g., rules specifying the minimum line width, minimum line spacing and the like) to produce a mask layout. After the layer design layout is complete, an OPC recipe may be applied to the initial design layout to produce a mask pattern that reproduces the design layout with better fidelity. The OPC recipe adds and/or modifies features in the design layout to compensate for distortion during the lithography step. A checking algorithm may then be applied to determine whether the proposed OPC features properly correct the layer design, so that features patterned using the mask will conform to design and processing requirements for the integrated circuit functionality and manufacturing yield.

DESCRIPTION OF DRAWINGS

Like reference symbols in the various drawings indicate like elements.

DETAILED DESCRIPTION

As noted above, correction features such as optical proximity correction or OPC features may be added to a mask design to improve pattern fidelity; that is, to decrease the difference between a design layout and the corresponding feature as patterned on a substrate.

In some prior systems, OPC features were added using an OPC recipe developed using a small number of test structures. The test structures were generally chosen as those structures that were known to be problematic (e.g., to produce features on a substrate that are distorted to an unacceptable degree in the absence of correction features).

However, this may not be adequate for some layer designs. For example, there may be forty or more design rules for a particular layer of an integrated circuit. Although circuit designers are constrained by the design rules, the number of permissible permutations is enormous. Therefore, the limited number of test structures used in these prior systems may not adequately represent the design-rule legal structures for a particular integrated circuit layer.

As a result, when an OPC recipe or technique developed using a limited set of test structures is applied to a layer design, the resulting modified layout including correction features may not adequately correct the design. Typically, a checking algorithm is applied to the proposed corrected design features to determine whether the correction is adequate. If it is not, the OPC recipe may need to be reworked. This takes time, and also may delay introduction of the new product to the market. The cost associated with a delayed product introduction can be quite significant.

Systems and techniques described herein may provide for more comprehensive sets of test structures. The test structures may be used to develop a correction algorithm that will adequately determine the configuration of correction features to be added to the mask or reticle, so that features patterned on the substrate using the mask or reticle adequately reflect the feature design intent. The current inventors recognized that providing a significantly more comprehensive set of test structures that comply with design rules allows the creation of robust, non-product specific correction that may avoid costly delays in product introduction.

Figure 2:
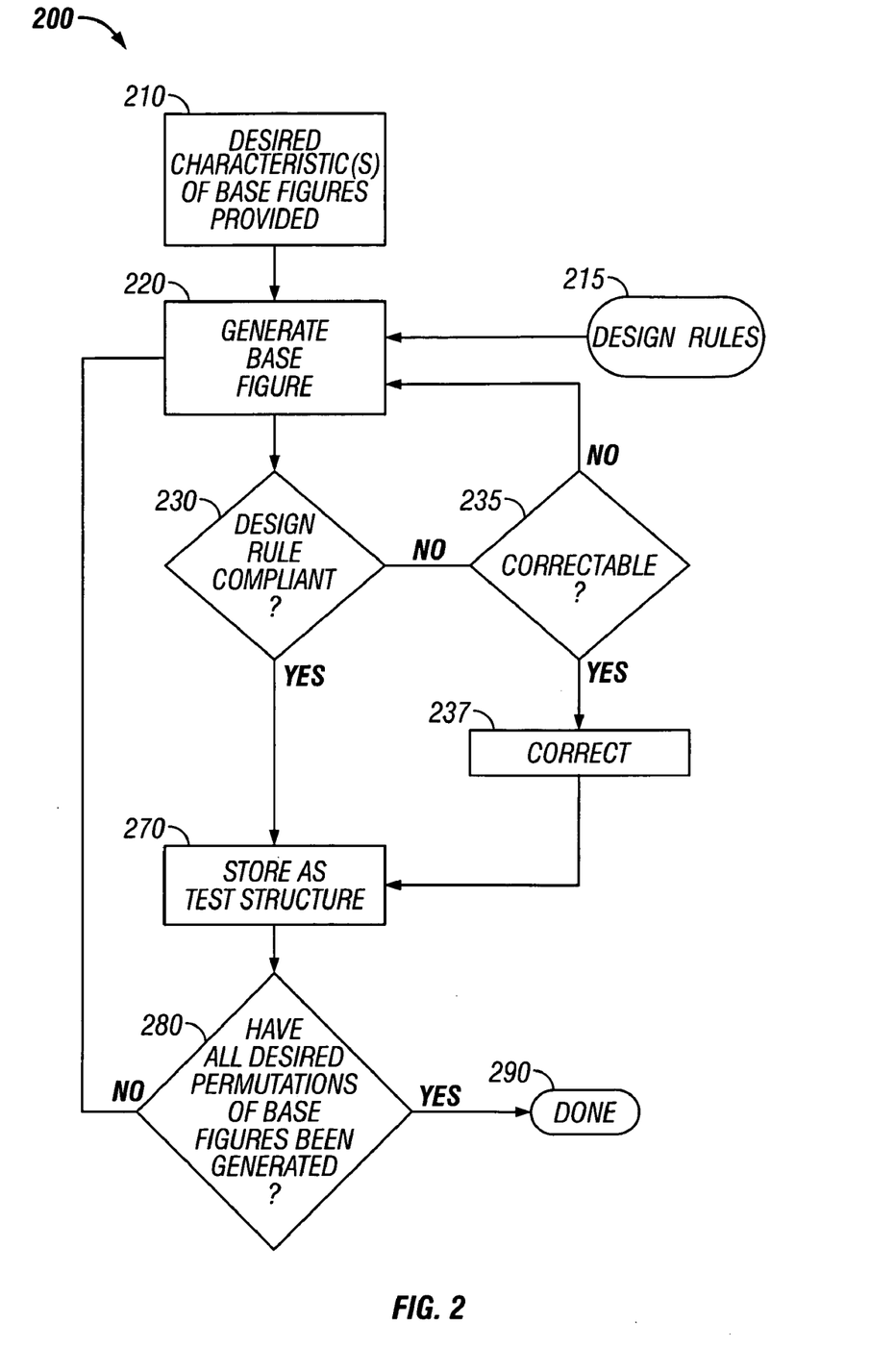
FIG. 2 shows an implementation of a method to produce a set of test structures.

FIG. 2 shows a method 200 that may be used to produce a set of test structures for a particular set of design rules, where each of the test structures includes a plurality of base figures with a set of one or more desired characteristics. At 210, one or more desired characteristics for the base figures are provided. For example, a user may input base figure characteristics such as a number of segments, range of segment lengths, and angles between segments. For example, a user may input five segment lengths and four angles between segments.

At 220, a first base figure may be generated using the base figure characteristics. At 230, the system may determine if the first base figure complies with the particular set of design rules 215. Alternately, the method may be implemented so that only design-rule compliant base figures are generated.

If the first base figure complies with the particular set of design rules, it may be stored at 270. For example, data indicative of the first base figure may be stored in a memory. The system may determine whether all desired permutations of base figures including the desired characteristics have been generated at 280. If so, the method may terminate at 290. If not, another base figure may be generated at 220.

If the first base figure does not comply with the particular set of design rules, the system may determine whether the error is correctible at 235. If so, the first base figure may be corrected at 237 and stored as a test structure at 270. If the error is not correctible, another base figure may be generated at 220.

Method 200 may be used to generate a set of design-rule compliant base figures having the desired characteristics (e.g., the desired number of segments, desired segment length, etc.). The set of base figures may be used as test structures, and may be subsequently used to test a correction algorithm such as an OPC algorithm.

However, the current inventors recognized that because interactions with neighboring structures may be important in lithography, testing the correction algorithm using test structures that include base figures in different environments may provide a significant benefit. That is, the set of test structures used to test the correction algorithm may include not only patterns representing portions of an integrated circuit, but may also include patterns representing neighboring portions of an integrated circuit.

Figure 3:
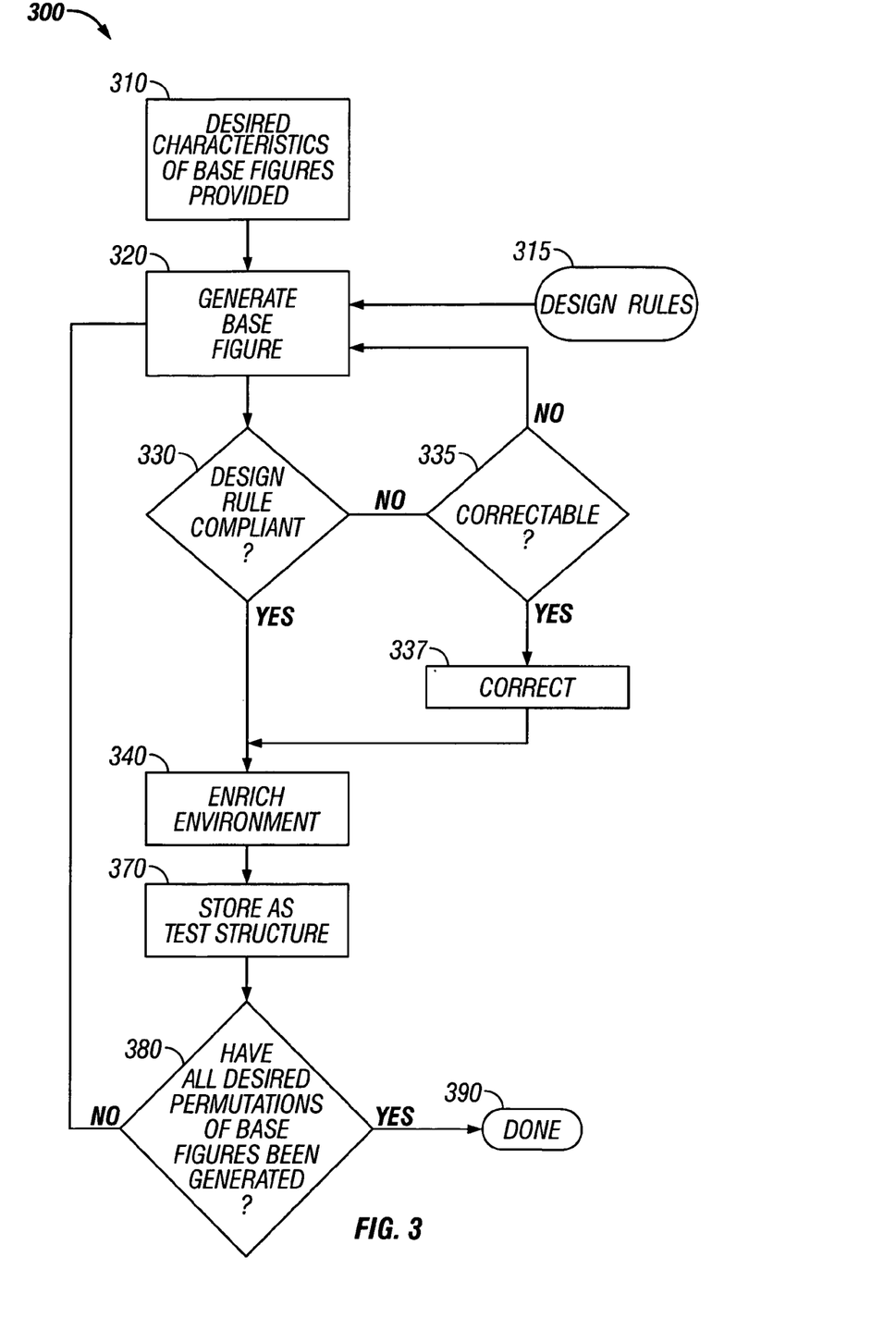
FIG. 3 shows an implementation of a method to produce a set of test structures including a base figure.

FIG. 3 shows an implementation of a method 300 in which base figures are generated, and in which a test structure includes a base figure in an enriched environment. For example, test structures may include base figures and one or more additional pattern portions proximate to the base figures.

At 310, one or more desired characteristics for the base figure are provided. At 320, a first base figure may be generated using the base figure characteristics. At 330, the system may determine if the first base figure complies with the particular set of design rules 315. Alternately, the method may be implemented so that only design-rule compliant base figures are generated.

If the first base figure does not comply with the particular set of design rules, the system may determine whether the error is correctible at 335. If so, the first base figure may be corrected at 337. If the error is not correctible, another base figure may be generated at 320.

One or more design rule compliant base figures may be stored as test structures (see the above description and FIG. 2). Additionally (or instead), the environment of at least one of the base figures may be enriched at 340, and one or more resulting test structures may be stored at 370. At 380, a determination made be made as to whether all desired permutations of base figures have been generated. If so, the generation of test structures completes at 390. If not, another base figure may be generated at 320.

Figure 4A:
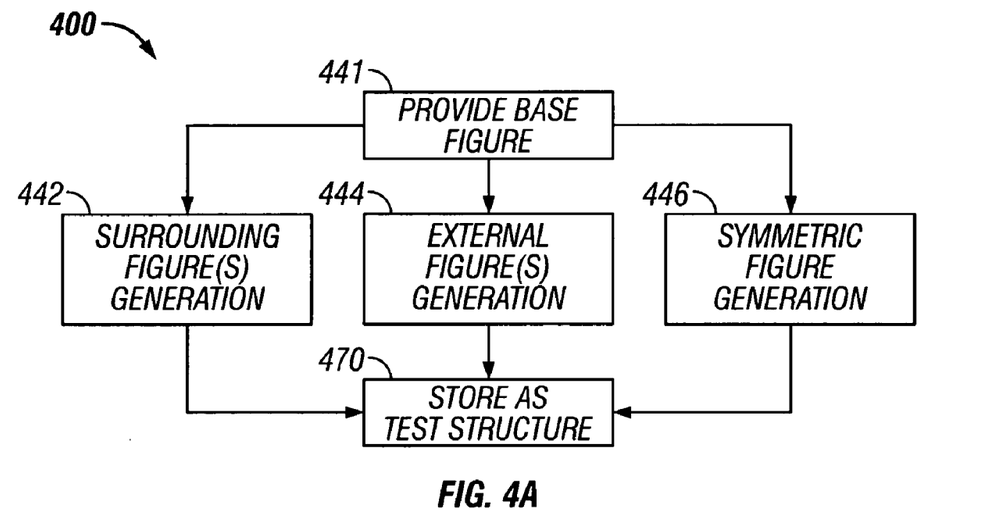
FIG. 4A shows an implementation of a method in which test structures with one or more additional pattern portions proximate to base figures.

The environment proximate to a base figure may be enriched in a number of ways. FIG. 4A shows a method 400 in which test structures with one or more additional pattern portions proximate to the base figures are generated. At 441, a base figure is provided. For example, the base figure may be generated as illustrated in FIGS. 2 and 3, or may be provided differently (e.g., from data representative of pre-viously-generated base figures). At 442, a surrounding figure may be generated.

Figure 4B:
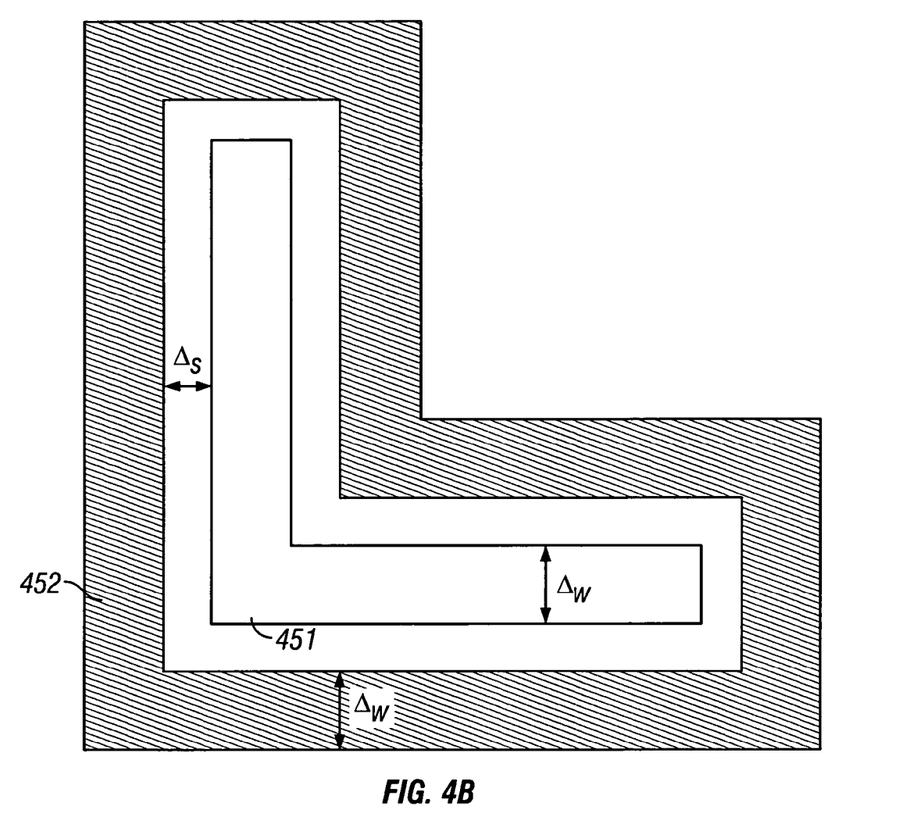
FIGS. 4B to 4E illustrate implementations of additional pattern portions proximate to base figures.

FIG. 4B illustrates a test structure including a surrounding FIG. 452 proximate to a base FIG. 451. In FIG. 4B, base FIG. 451 has a first shape (shown as generally L-shaped for illustration) and a first size. Base FIG. 451 has two segments, with an angle of 90 degrees between the segments. Surrounding FIG. 452 has a substantially similar second shape, and a larger second size. A test structure including surrounding FIG. 452 provides a different proximity environment than a test structure including base FIG. 451 alone. Surrounding FIG. 452 is offset from base FIG. 451 by a distance $\Delta_s$, as shown. Distance $\Delta_s$ may conform to a minimum space design rule. In FIG. 4B, both base FIG. 451 and surrounding FIG. 452 have a line width $\Delta_w$, although the line widths need not be the same.

Figure 4C:
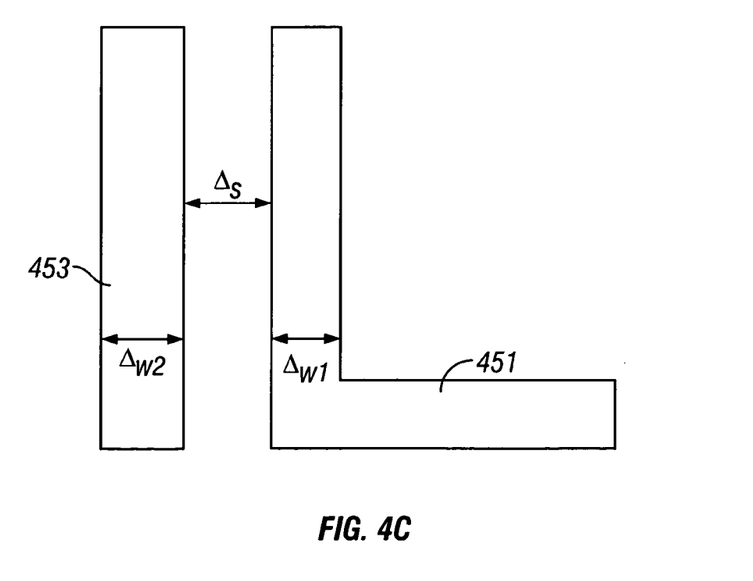

Referring again to FIG. 4A, one or more external figures may be generated at 444. FIG. 4C illustrates a test structure including an external FIG. 453 proximate to a base FIG. 451. In FIG. 4C, base FIG. 451 has a first shape (shown as generally L-shaped for illustration). External FIG. 453 has a second shape different from the first shape: it is generally rectangular. A segment of external FIG. 453 is offset from base FIG. 451 by a distance $\Delta_s$, as shown. In FIG. 4C, base FIG. 451 has a line width $\Delta_{w1}$, while external FIG. 453 has a different line width $\Delta_{w2}$, although the line widths may be the same.

Test structures with different numbers and configurations of external figures may be generated. A set of rules governing the generation of external figures may be provided. For example, rules governing the configuration (e.g., number of segments, lengths of segments, angles between segments) of external figures may be provided, and different permutations of external figures complying with the rules may be generated. Test structures including the base figure and the different permutations of external figures may be generated and stored. For example, in addition to storing the test structure shown in FIG. 4B, test structures including base FIG. 451 and external figures of different shapes, sizes, configurations, and/or proximate positions to base FIG. 451 may be generated.

Referring again to FIG. 4A, one or more symmetric figures may be generated at 446. Symmetric figure generation is a special case of external figure generation. The current inventors recognized that test structures including a base figure and a symmetric figure may be particularly beneficial in testing correction algorithms. For example, test structures including a base figure and a symmetric figure may be able to detect marginalities (i.e., structures in which the pattern fidelity is close to the limit of acceptable pattern fidelity) with better sensitivity.

Figure 4D:
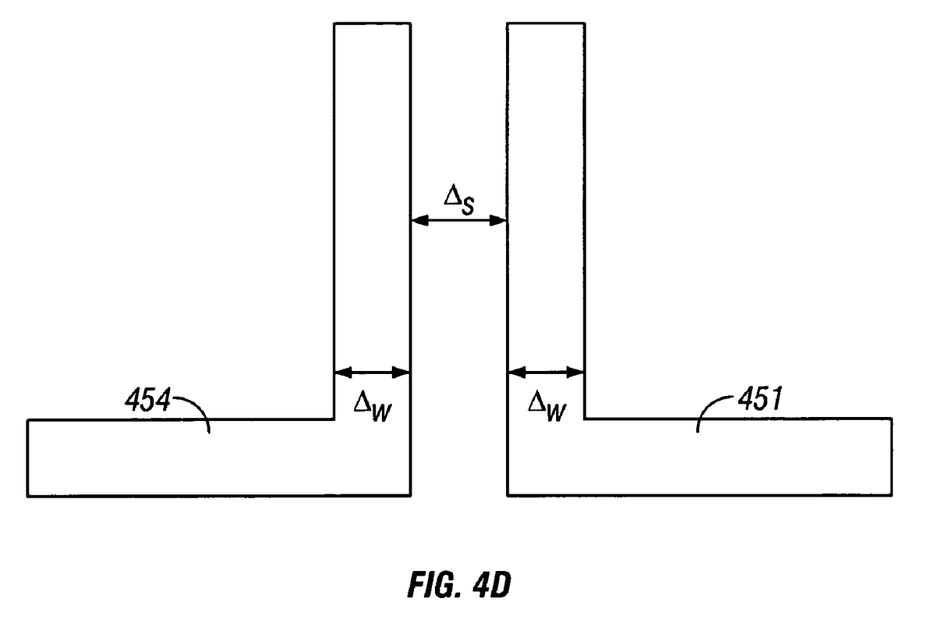

FIG. 4D illustrates a test structure including a first exemplary symmetric FIG. 454 proximate to a base FIG. 451. First symmetric FIG. 454 is generated to have mirror symmetry with base FIG. 451. Note that other figures having mirror symmetry with base FIG. 451, and test structures including those figures and base FIG. 451 may be stored as test structures to be used to test one or more correction algorithms.

Figure 4E:
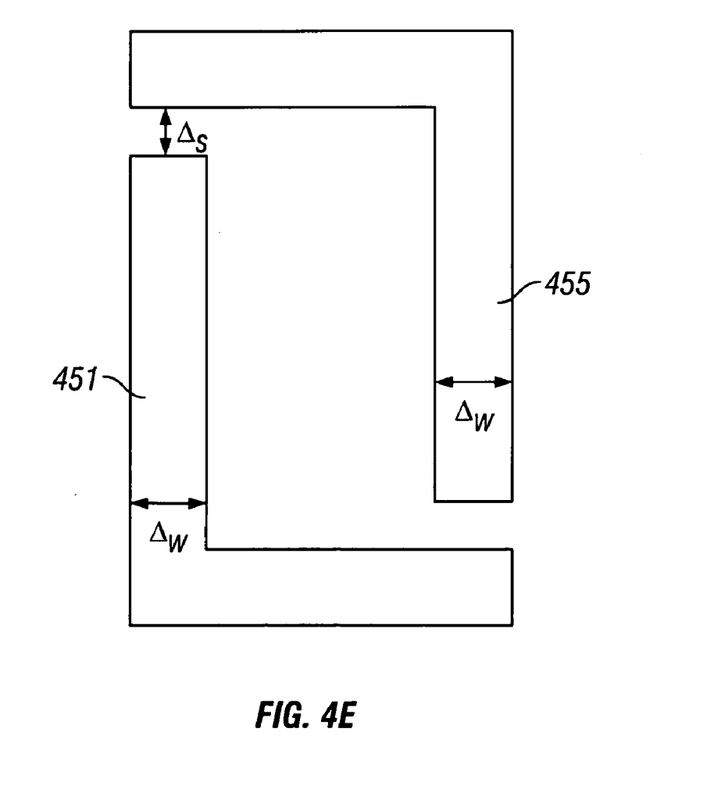

FIG. 4E illustrates a test structure including a second exemplary symmetric FIG. 455 proximate to a base FIG. 451. Second symmetric FIG. 455 is generated to have point symmetry with base FIG. 451. Again, other figures having point symmetry with base FIG. 451 may be generated and test structures including the other point symmetric figures stored and used to check a correction algorithm.

A set of test structures may be generated using the methods of FIGS. 2–4. The set of test structures may include base figures, base figures with surrounding figures, base figures with external figures, and/or base figures with symmetric figures. The set of test structures need not include all of these types of test structures, and need not include all possible permutations of the types of test structures included. Additionally, other test structures may be generated (e.g., test structures with a base figure, a surrounding figure, and additionally one or more external figures to the surrounding figure).

Figure 5:
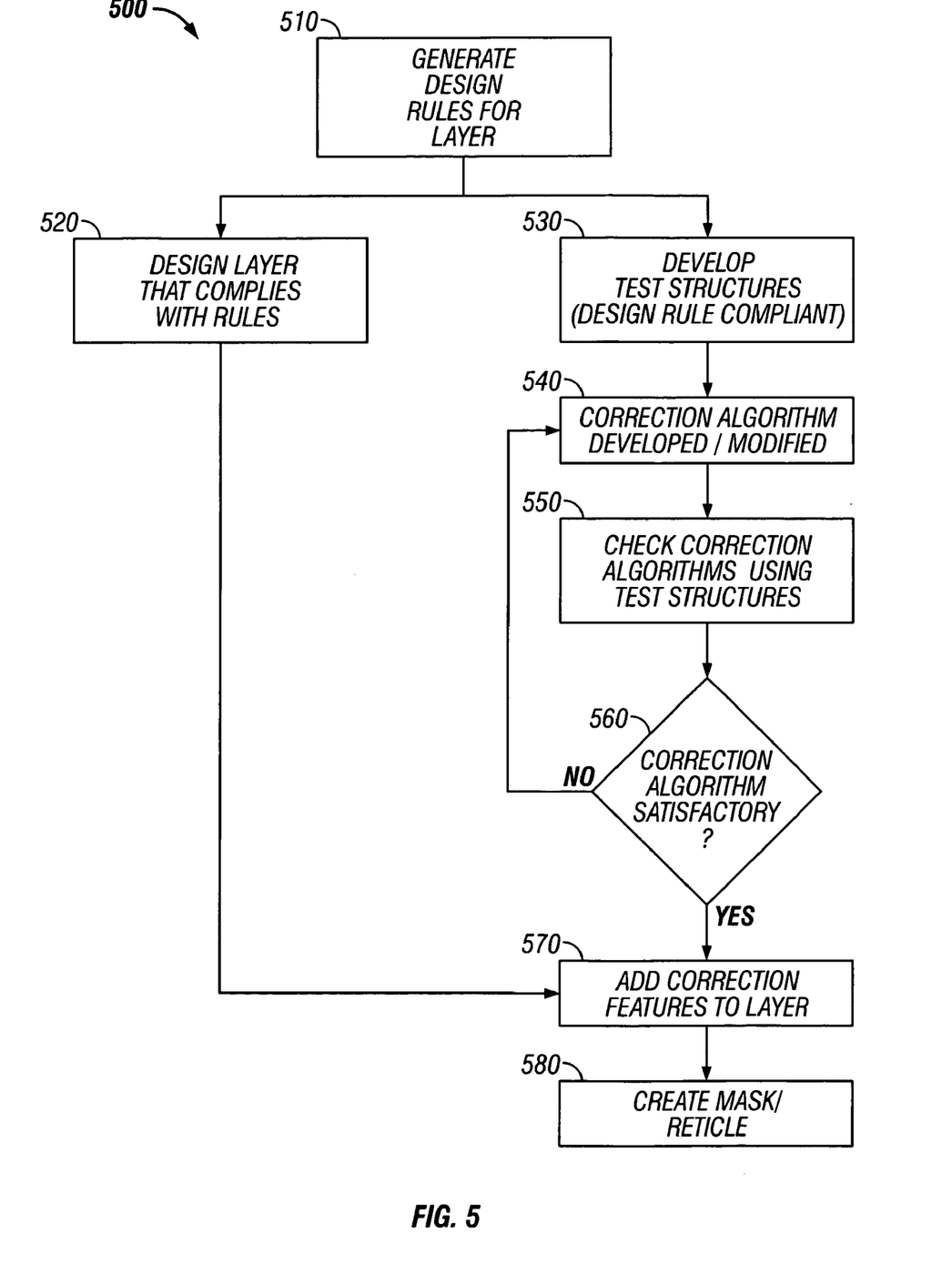
FIG. 5 shows an implementation for using test structures to verify a correction algorithm.

FIG. 5 shows a method 500 for using the test structures to verify a correction algorithm to be used with a layer design governed by a set of design rules. At 510, a set of design rules for a particular layer may be generated. At 520, the layer design is created using the set of design rules.

At 530, test structures may be generated for testing a correction algorithm. At 540, an initial correction algorithm may be developed. At 550, the correction algorithm may be checked using the test structures. At 560, a determination of whether the correction algorithm is satisfactory is made. If it is not, the correction algorithm is modified at 540 and checked again at 550. If the correction algorithm adequately corrects the test structures, it may be used to add correction features to the layer design at 570. At 580, a mask or reticle including the design and correction features may be manufactured to be used to produce an integrated circuit, where the integrated circuit includes a pattern with features formed using the mask or reticle.

A number of implementations have been described. Nevertheless, it will be understood that various modifications may be made without departing from the spirit and scope of the invention. For example, the systems and techniques described herein may be used with lithography incorporating wavelengths of light within or outside of the visible portion of the spectrum, or with particles such as electrons or ions. Different types and configurations of figures may be used in addition to the L-shaped and I-shaped figures used to illustrate the methods described above. Additionally, an "additional" feature encompasses implementations in which other changes are made to the pattern (e.g., where the additional feature at least partially replaces a feature of the layer layout rather than being added to the unmodified layer layout). Accordingly, other embodiments are within the scope of the following claims.

What is claimed is:

1. A method comprising:
accessing rules for generating test structures, wherein the test structures are used to test one or more correction algorithms for adding corrective features to a semiconductor part, the semiconductor part for patterning a portion of one or more integrated circuits;
receiving information describing a base figure, the base figure representing a potential feature in the portion of the one or more integrated circuits, the base figure having an outer border of a first shape and a first size;
generating, in accordance with the rules, information describing a second figure positioned proximate to the base figure, the second figure representing a second potential feature in the portion of the one or more integrated circuits; and
making the information describing the second figure available to test the one or more correction algorithms as part of a test structure.

2. The method of claim 1, wherein the second figure comprises a surrounding figure having an inner border of a second shape substantially the same as the first shape and a second size greater than the first size.

3. The method of claim 2, wherein:
the rules for generating test structures include a rule defining a minimum separation between features of the test structure; and
a distance between the outer border of the base figure and the inner border of the another figure is greater than or equal to the minimum separation.

4. The method of claim 1, wherein the second figure comprises an external figure having an outer border of a second shape.

5. The method of claim 4, wherein the second shape is substantially the same as the first shape.

6. The method of claim 4, wherein the second shape is different from the first shape.

7. The method of claim 4, wherein:
the rules for generating test structures include a rule defining a minimum separation between features of the test structure; and
a distance between the outer border of the base figure and the outer border of the second figure is greater than or equal to the minimum separation.

8. The method of claim 1, wherein:
the second figure is a substantially symmetric figure;
the second figure has an outer border of a second shape substantially the same as the first shape and a second size substantially the same as the first size; and
the second figure is symmetric to the base figure.

9. The method of claim 8, wherein the second figure is mirror symmetric to the base figure.

10. The method of claim 8, wherein the second figure is symmetric to the base figure about a point.

11. The method of claim 1, wherein the semiconductor part comprises at least one of a mask and a reticle.

12. The method of claim 1, further comprising:
storing the information describing the base figure and the information describing the second figure as a test structure.

13. The method of claim 12, further comprising:
using the test structure to test the one or more correction algorithms.

14. The method of claim 13, wherein using the test structure to test the one or more correction algorithms comprises determining correction features to be added to the semiconductor part.

15. The method of claim 14, further comprising:
determining whether the correction features provide integrated circuit features that correspond to the test structure to within an acceptable error amount.

16. The method of claim 1, wherein the base figure and the second figure are included in at least one test structure.

17. The method of claim 1, wherein receiving the information describing the base figure comprises generating the information describing the base figure using a permutation of a combination of a segment length and an angle.

18. The method of claim 1, wherein the one or more correction algorithms are for adding corrective features to a design database for manufacturing the semiconductor part.

19. A method comprising:
receiving one or more characteristics of base figures, each base figure representing a potential feature in a layer of an integrated circuit;
automatically generating information describing a plurality of different test structures based on the base figures;
storing the plurality of different test structures, wherein each of the plurality of different test structures is in accordance with layer design rules; and
making the plurality of different test structures available to test an algorithm for ensuring that features of a reticle adequately reflect design intent.

20. The method of claim 19, wherein the one or more characteristics comprises a number of segments in the base figures.

21. The method of claim 19, further comprising:
after generating information describing a first test structure of the plurality of different test structures, determining whether the first test structure obeys the layer design rules.

22. The method of claim 21, further comprising:
if the first test structure is not in accordance with the layer design rules, determining whether the first test structure may be modified to obey the layer design rules.

23. The method of claim 22, further comprising modifying the first test structure to be in accordance with the layer design rules.

24. The method of claim 19, wherein automatically generating the information describing the plurality of different test structures includes generating information describing a first base figure.

25. The method of claim 24, wherein automatically generating the information describing the plurality of different test structures comprises automatically generating information describing another figure positioned proximate to the first base figure.

26. An article comprising one or more storage media having stored thereon instructions that when executed by one or more machines results in operations, the operations comprising:
receiving rules for generating test structures, wherein the test structures are used to test one or more correction algorithms for adding corrective features to a semiconductor part, the semiconductor part for patterning a portion of one or more integrated circuits;
receiving information describing a base figure, the base figure representing a potential feature in the portion of the one or more integrated circuits, the base figure having an outer border of a first shape and a first size;
generating, in accordance with the rules, information describing a second figure positioned proximate to the base figure, the second figure representing a second potential feature in the portion of the one or more integrated circuits; and
making the information describing the second figure available to test the one or more correction algorithms as part of a test structure.

27. The article of claim 26, wherein the second figure comprises a surrounding figure having an inner border of a second shape substantially the same as the first shape and a second size greater than the first size.

28. The article of claim 27, wherein:
the rules for generating test structures include a rule defining a minimum separation between features of the test structure; and
a distance between the outer border of the base figure and the inner border of the another figure is greater than or equal to the minimum separation.

29. The article of claim 26, wherein the second figure comprises an external figure having an outer border of a second shape.

30. The article of claim 29, wherein the second shape is substantially the same as the first shape.

31. The article of claim 29, wherein the second shape is different from the first shape.

32. The article of claim 29, wherein:
the rules for generating test structures include a rule defining a minimum separation between features of the test structure; and
a distance between the outer border of the base figure and the outer border of the second figure is greater than or equal to the minimum separation.

33. The article of claim 26, wherein:
the second figure is a substantially symmetric figure;
the second figure has an outer border of a second shape substantially the same as the first shape and a second size substantially the same as the first size; and
the second figure is symmetric to the base figure.

34. The article of claim 33, wherein the second figure is mirror symmetric to the base figure.

35. The method of claim 33, wherein the second figure is symmetric to the base figure about a point.

36. The article of claim 26, wherein the semiconductor part comprises at least one of a mask and a reticle.

37. The article of claim 26, wherein the operations further comprise:
storing the information describing the base figure and the information describing the second figure as a test structure.

38. The article of claim 37, wherein the operations further comprise: using the test structure to test the one or more correction algorithms.

39. The article of claim 38, wherein using the test structure to test the one or more correction algorithms comprises determining correction features to be added to the semiconductor part.

40. The article of claim 39, wherein the operations further comprise:
determining whether the correction features provide integrated circuit features that correspond to the test structure to within an acceptable error amount.

41. The article of claim 26, wherein the base figure and the second figure are included in at least one test structure.

42. The article of claim 41, wherein receiving the information describing the base figure comprises generating the information describing the base figure using a permutation of a combination of a segment length and an angle.

43. The article of claim 26, wherein the one or more correction algorithms are for adding corrective features to a design database for manufacturing the semiconductor part.

44. An article comprising one or more storage media having stored thereon instructions that when executed by one or more machines results in operations, the operations comprising:
receiving one or more characteristics of base figures, each base figure representing a potential feature in a layer of an integrated circuit;
automatically generating information describing a plurality of different test structures based on the base figures;
storing the plurality of different test structures, wherein each of the plurality of different test structures is in accordance with the layer design rules; and
making the plurality of different test structures available to test an algorithm for ensuring that features of a reticle adequately reflect design intent.

45. The article of claim 44, wherein the one or more characteristics comprises a number of segments in the base figures.

46. The article of claim 44, wherein the operations further comprise:
after generating information describing a first test structure of the plurality of different test structures, determining whether the first test structure is in accordance with the layer design rules.

47. The article of claim 46, wherein the operations further comprise:
if the first test structure is not in accordance with the layer design rules, determining whether the first test structure may be modified to obey the layer design rules.

48. The article of claim 47, wherein the operations further comprise modifying the first test structure to be in accordance with the plurality of design rules.

49. The article of claim 44, wherein automatically generating the information describing the plurality of different test structures includes generating information describing a first base figure.

50. The article of claim 49, wherein automatically generating the information describing the plurality of different test structures comprises automatically generating information describing a second figure positioned proximate to the first base figure.

* * * * *